United States Patent
Shiga

(10) Patent No.: US 7,619,920 B2
(45) Date of Patent: Nov. 17, 2009

(54) NAND TYPE FLASH MEMORY AND WRITE METHOD OF THE SAME

(75) Inventor: Hitoshi Shiga, Milpitas, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 11/773,771

(22) Filed: Jul. 5, 2007

(65) Prior Publication Data
US 2009/0010063 A1    Jan. 8, 2009

(51) Int. Cl.
*G11C 11/34* (2006.01)
(52) U.S. Cl. ............................. 365/185.03; 365/185.17
(58) Field of Classification Search ............ 365/185.03, 365/185.17, 185.22
See application file for complete search history.

(56) References Cited

U.S. PATENT DOCUMENTS

| | | | |
|---|---|---|---|
| 6,091,640 A * | 7/2000 | Kawahara et al. ...... | 365/185.28 |
| 6,914,823 B2 * | 7/2005 | Chen et al. ............. | 365/185.22 |
| 7,349,249 B2 * | 3/2008 | Honma et al. .......... | 365/185.03 |
| 7,426,138 B1 * | 9/2008 | Wong ..................... | 365/185.03 |

FOREIGN PATENT DOCUMENTS

JP    2005-235260    9/2005

\* cited by examiner

*Primary Examiner*—Anh Phung
(74) *Attorney, Agent, or Firm*—Oblon, Spivak, McClelland, Maier & Neustadt, L.L.P.

(57) ABSTRACT

A NAND type flash memory includes first to third memory cell transistors having current paths connected in series between one end of a current path of each of first and second selection transistors, and each having a control gate and a charge storage layer, the first and second memory cell transistors being adjacent to the first and second selection transistors, the third memory cell transistor being positioned between the first and second memory cell transistors, the third memory cell transistor holding data having not less than three bits, the first memory cell transistor holding 2-bit data in which middle and upper pages is written by skipping a lower page, and a lower page verify voltage being set when writing the middle page, and a middle page verify voltage is set when writing the upper page, changing a position of a threshold distribution of the first memory cell transistor.

20 Claims, 15 Drawing Sheets

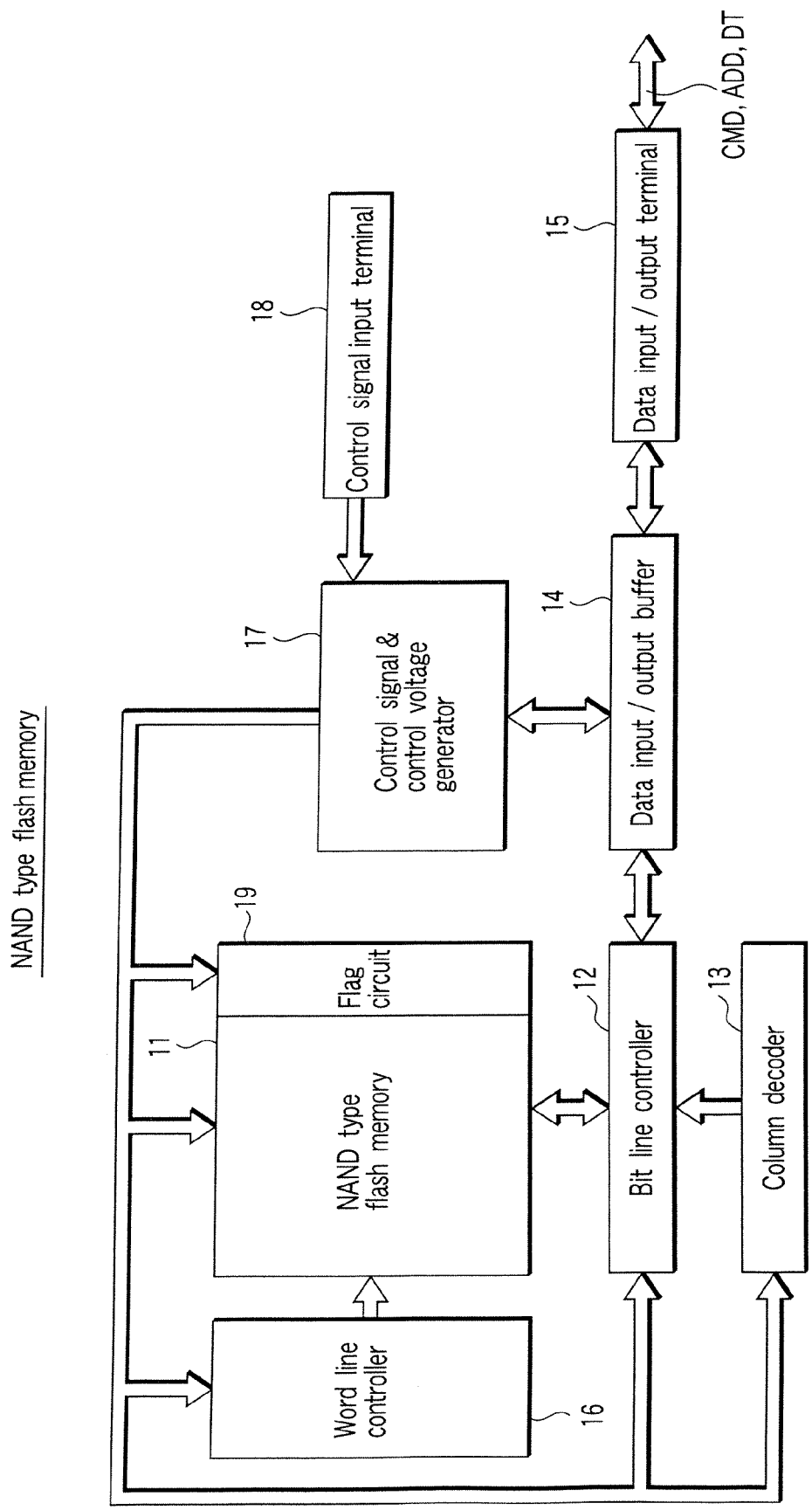
F I G. 1

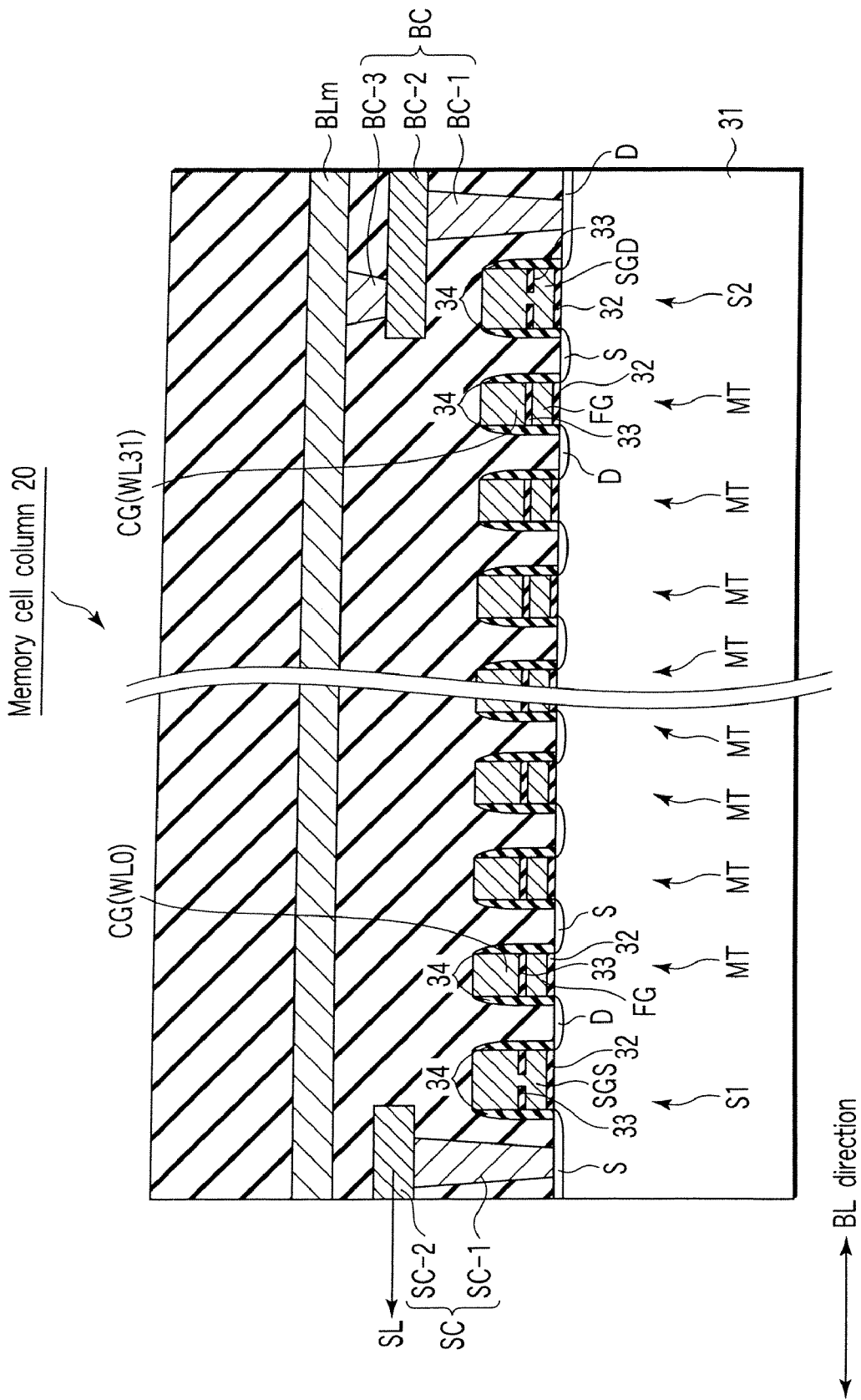
F I G. 3

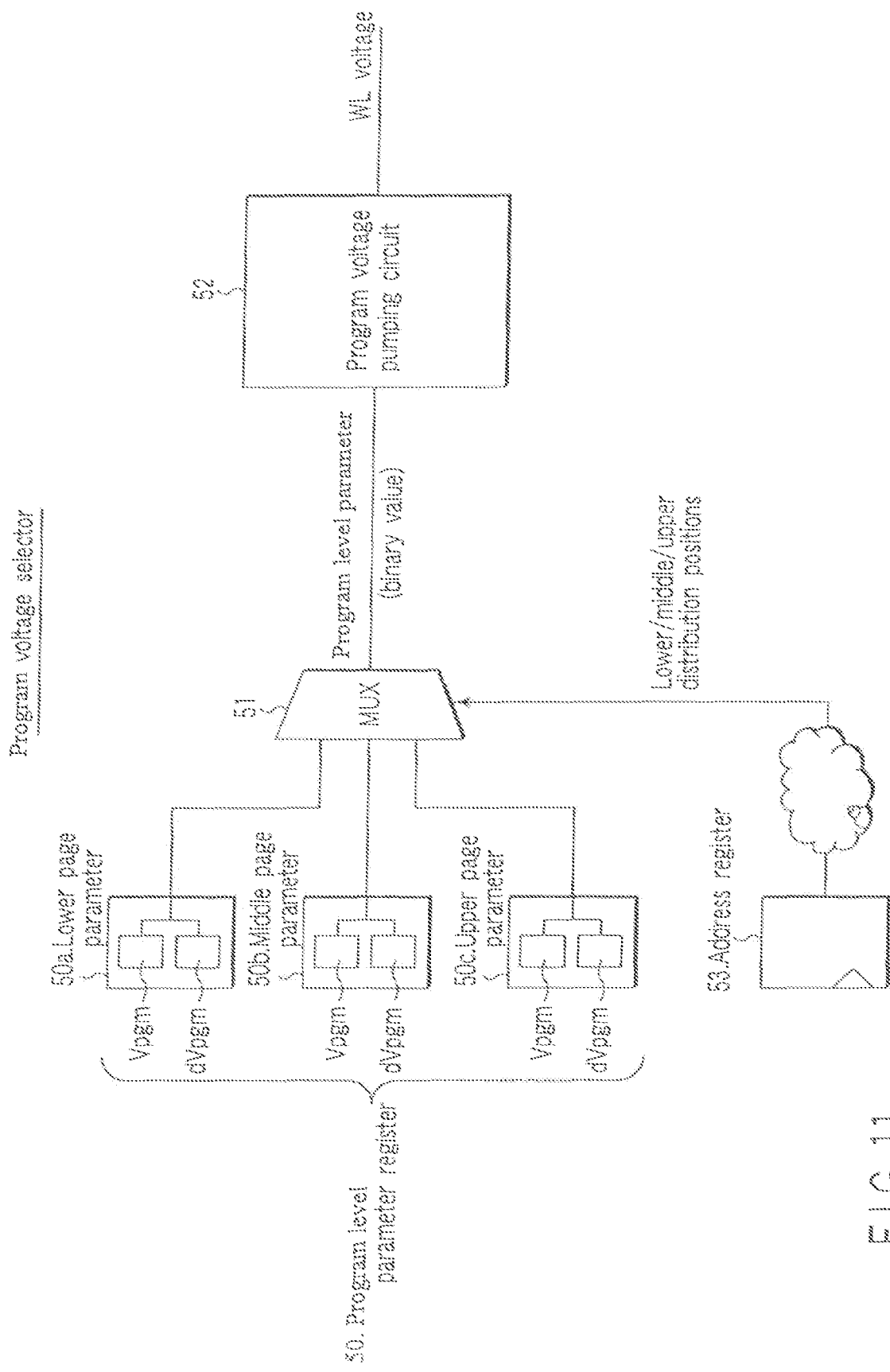
F I G. 11

NAND TYPE FLASH MEMORY AND WRITE METHOD OF THE SAME

BACKGROUND OF THE INVENTION

1. Field of the Invention

The present invention relates to a multilevel NAND type flash memory and a write method of the same.

2. Description of the Related Art

A NAND type flash memory is useful as a large-capacity nonvolatile memory (e.g., Jpn. Pat. Appln. KOKAI Publication No. 2005-235260). Recently, a multilevel NAND type flash memory that stores data having a plurality of bits in one memory cell has been proposed.

Unfortunately, threshold distributions held in memory cells of this multilevel NAND type flash memory have the problem that the width of a threshold distribution corresponding to each individual data and the interval between the threshold distributions of different data are small, and this makes it difficult to ensure the data reliability. In particular, micropatterning of memory cells makes it most difficult to assure the reliability of memory cells connected to a word line WL0 adjacent to a selection gate line on the source line side.

Micropatterning also increases the influence of coupling between charge storage layers of adjacent memory cells; the threshold value of a memory cell in which data is already written is influenced by the fluctuation in threshold value of an adjacent memory cell in which data is written later.

In the multilevel NAND type flash memory that holds data having three or more bits in one memory cell, the reliability of memory cells adjacent to the selection gate line and the coupling effect between adjacent memory cells are serious problems.

BRIEF SUMMARY OF THE INVENTION

A NAND type flash memory according to the first aspect of the present invention comprising a first selection transistor, a second selection transistor, a first memory cell transistor, a second memory cell transistor, and a third memory cell transistor having current paths connected in series between one end of a current path of the first selection transistor and one end of a current path of the second selection transistor, and each having a control gate and a charge storage layer, the first memory cell transistor being adjacent to the first selection transistor, the second memory cell transistor being adjacent to the second selection transistor, the third memory cell transistor being not adjacent to the first selection transistor and the second selection transistor and being positioned between the first memory cell transistor and the second memory cell transistor, the third memory cell transistor holding data having not less than three bits, the first memory cell transistor holding 2-bit data in which a middle page and an upper page is written by skipping a lower page, and a lower page verify voltage being set when writing the middle page, and a middle page verify voltage is set when writing the upper page, changing a position of a threshold distribution of the first memory cell transistor.

A write method of a NAND type flash memory according to the second aspect of the present invention comprising a first selection transistor, a second selection transistor, a first memory cell transistor, a second memory cell transistor, and a third memory cell transistor having current paths connected in series between one end of a current path of the first selection transistor and one end of a current path of the second selection transistor, and each having a control gate and a charge storage layer, the first memory cell transistor being adjacent to the first selection transistor, the second memory cell transistor being adjacent to the second selection transistor, the third memory cell transistor being not adjacent to the first selection transistor and the second selection transistor and being positioned between the first memory cell transistor and the second memory cell transistor, data having not less than three bits being written in the third memory cell transistor, 2-bit data being written in the first memory cell transistor by skipping a lower page, writing a middle page, and then writing an upper page, and a lower page verify voltage being set when writing the middle page, and a middle page verify voltage is set when writing the upper page, changing a position of a threshold distribution of the first memory cell transistor.

BRIEF DESCRIPTION OF THE SEVERAL VIEWS OF THE DRAWING

FIG. 1 is a block diagram of the overall configuration of a NAND type flash memory according to an embodiment of the present invention;

FIG. 3 is a sectional view of a portion in the bit line direction of the memory cell array according to the embodiment of the present invention;

FIG. 11 is a schematic view of a verify voltage selector for write according to the embodiment of the present invention;

DETAILED DESCRIPTION OF THE INVENTION

Figure 2:
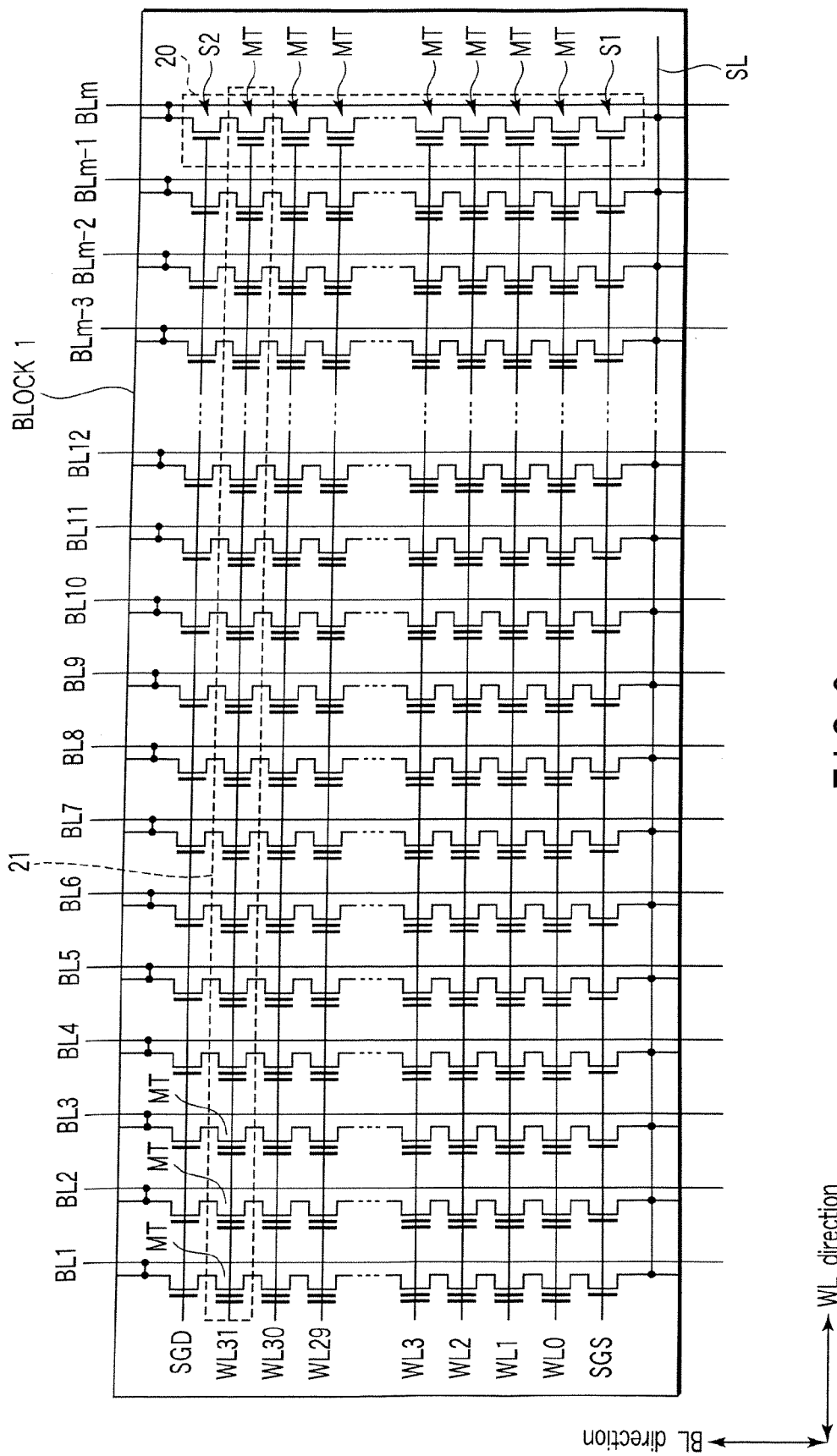
FIG. 2 is a view showing an example of the arrangement of a block in a memory cell array according to the embodiment of the present invention.

An embodiment of the present invention will be explained below with reference to the accompanying drawing. In this explanation, the same reference numerals denote the same parts throughout the drawing.

The following embodiment will be explained by taking a NAND type flash memory as an example of a nonvolatile semiconductor memory.

[1] Overall Configuration

FIG. 1 is a block diagram of the overall configuration of the NAND type flash memory according to the embodiment of the present invention. The overall configuration of the NAND type flash memory according to this embodiment will be explained below.

As shown in FIG. 1, this NAND type flash memory comprises a memory cell array 11, bit line controller 12, column decoder 13, data input/output buffer 14, data input/output terminal 15, word line controller 16, control signal & control voltage generator 17, control signal input terminal 18, and flag circuit 19.

The memory cell array 11 includes a plurality of blocks. The memory cell array 11 is connected to the bit line controller 12 for controlling bit lines and the word line controller 16 for controlling word lines. The flag memory cell (flag circuit) 19 is formed adjacent to the memory cell array 11. The flag circuit 19 has a memory cell array similar to the memory cell array 11.

The bit line controller 12 reads out data from memory cell transistors in the memory cell array 11 via bit lines, and detects the states of memory cell transistors in the memory cell array 11 via bit lines. The bit line controller 12 also writes data in memory cells by applying a write control voltage to memory cell transistors in the memory cell array 11 via bit lines.

The bit line controller 12 is connected to the column decoder 13 and data input/output buffer 14. Data storage circuits (not shown) are formed in the bit line controller 12, and selected by the column decoder 13. Data read out from memory cell transistors to the data storage circuits (not shown) are output outside from the data input/output terminal 15 via the data input/output buffer 14.

The data input/output terminal 15 is connected to, e.g., a host apparatus outside the NAND type flash memory. The host apparatus is a microcomputer or the like, and receives output data from the data input/output terminal 15. In addition, the host apparatus outputs various commands CMD for controlling the operation of the NAND type flash memory, addresses ADD, and data DT. Write data input from the host apparatus to the data input/output terminal 15 is supplied, via the data input/output buffer 14, to the data storage circuit (not shown) selected by the column decoder 13. On the other hand, the commands CMD and addresses ADD are supplied to the control signal & control voltage generator 17.

The word line controller 16 selects a word line in the memory cell array 11, and applies a read, write, or erase voltage to the selected word line.

The control signal & control voltage generator 17 is connected to the memory cell array 11, bit line controller 12, column decoder 13, data input/output buffer 14, word line controller 17, and flag controller 19. The control signal & control voltage generator 17 controls the connected circuits. The control signal & control voltage generator 17 is connected to the control signal input terminal 18, and controlled by a control signal such as an ALE (Address Latch Enable) signal input from the host apparatus via the control signal input terminal 18.

The bit line controller 12, column decoder 13, word line controller 16, and control signal & control voltage generator 17 constitute a write circuit and read circuit.

[2] Example of Block Configuration

FIG. 2 shows an example of the arrangement of a block in the memory cell array according to the embodiment of the present invention. A block BLOCK1 forming the memory cell array according to this embodiment will be explained below as an example.

As shown in FIG. 2, the block BLOCK1 comprises memory cell columns 20 arranged in the word line direction (WL direction).

Each memory cell column 20 comprises, e.g., 32 memory cell transistors MT and selection transistors S1 and S2. The 32 memory cell transistors MT form a NAND string having series-connected current paths. One end of the current path of the selection transistor S1 is connected to one end of this NAND string, and one end of the current path of the selection transistor S2 is connected to the other end of the NAND string. The other end of the current path of the selection transistor S1 is connected to a source line SL, and the other end of the current path of the selection transistor S2 is connected to a bit line BLm. Note that the 32 memory cell transistors MT form the NAND string in this example, but the number of memory cells forming the NAND string need only be two or more and is not particularly limited to 32.

Word lines WL0 to WL31 run in the WL direction, and are each connected to the memory cell transistors MT in the WL direction. A selection gate line SGS runs in the WL direction, and is connected to the selection transistors S1 in the WL direction. A selection gate line SGD runs in the WL direction, and is connected to the selection transistors S2 in the WL direction. Note that in this example, the word line adjacent to the selection gate line SGS is given WL0, the word line numbers from WL0 to WL30 are given in the direction away from the selection gate line SGS, and the word line adjacent to the selection gate line SGD is given WL31.

A page 21 exists for each of the word lines WL0 to WL31. For example, as indicated by the broken lines in FIG. 2, the page 21 including m cells exists for the word line WL31. Since a read operation and write operation are performed for each page 21, the page 21 is a read unit and write unit.

Data in the memory cell transistors MT in the block BLOCK1 are simultaneously erased. That is, the block is an erase unit.

Note that the memory cell array 11 of this embodiment has a plurality of blocks BLOCK1 shown in FIG. 2, and functions as an MLC (Multi Level Cell) capable of recording multi-bit data in one memory cell transistor MT.

[3] Example of Sectional Structure in Bit Line Direction

FIG. 3 is a sectional view of a portion in the bit line direction of the memory cell array according to the embodiment of the present invention. A portion of the sectional structure in the bit line direction of the memory cell array according to this embodiment will be explained below. The sectional structure of the memory cell column 20 of the bit line BLm shown in FIG. 2 will be explained as an example.

As shown in FIG. 3, the memory cell column 20 comprises the selection transistors S1 and S2 for selecting the memory cell column 20, and the memory cell transistors MT. The memory cell transistors MT and selection transistors S1 and S2 are formed on the semiconductor substrate 30 made of, e.g., silicon.

The memory cell transistor MT has a stacked structure including a control gate CG and charge storage layer (floating gate) FG (the word line WL). A gate insulating film 32 is formed below the control gate CG, and an inter-gate insulating film 33 is formed between the control gate CG and charge storage layer FG. Spacers 34 are formed on the side surfaces of the stacked structure of the memory cell transistor MT. A source diffusion layer S and drain diffusion layer D sandwiching the stacked structure of the memory cell transistor MT are formed in the semiconductor substrate 31.

The selection transistors S1 and S2 each have the gate insulating film 32, the inter-gate insulating film 33, and a gate electrode G. The inter-gate insulating film of each of the selection transistors S1 and S2 is separated in the center to electrically connect the layers, above and below the inter-gate insulating film 33, of the gate electrode G. The gate electrode G is made of, e.g., a polysilicon layer, and a silicide layer may also be formed on this polysilicon layer. Spacers 34 are formed on the side surfaces of the gate electrode G. A source diffusion layer S and drain diffusion layer D sandwiching the gate electrode G of each of the selection transistors S1 and S2 are formed in the semiconductor substrate 31.

The memory cell transistors MT are connected in series by sharing the source diffusion layers S and drain diffusion layers D as the current paths with adjacent memory cell transistors MT. This forms a NAND string in which the memory cell transistors MT are connected in series with each other. One end of the current path of this NAND string is connected to the source line SL via the selection transistor S1 and source line contacts SC-1 and SC-2. The other end of the NAND string is connected to the bit line BLm via the selection transistor S2 and bit line contacts BC-1 to BC-3.

[4] Write Method

[4-1] Outline

Figure 4:
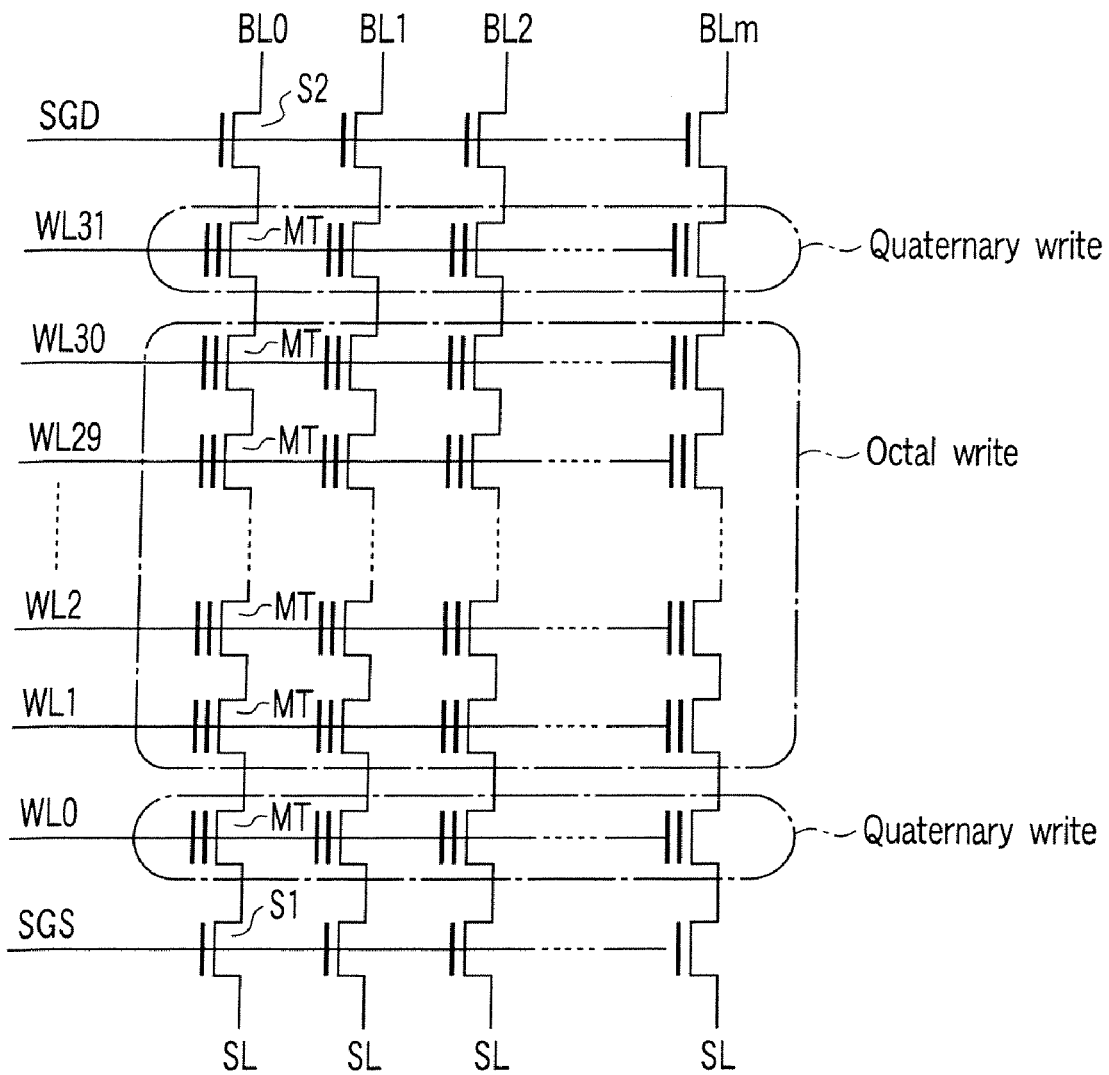
FIG. 4 is a view for explaining an outline of a write method of the NAND type flash memory according to the embodiment of the present invention.

FIG. 4 is a view for explaining an outline of a write method of the NAND type flash memory according to the embodiment of the present invention. The outline of the write method of this embodiment will be explained below.

The multilevel NAND type flash memory of this embodiment writes data as follows in order to improve the reliability of particularly the memory cell transistors MT adjacent to the selection transistors S1 and S2.

(1) The memory cell transistors adjacent to the selection transistors S1 and S2 hold 2-bit (quaternary) data, and other memory cell transistors hold 3-bit (octal) data. Note that memory cell transistors not adjacent to the selection transistors S1 and S2 can also hold data having three or more bits.

(2) When writing two bits in the memory cell adjacent to the selection transistor S1 on the source line SL side, write of a lower page is skipped, and a middle page and upper page are written. In this case, the position of the threshold distribution of a verify read level is changed to set a lower page verify voltage Vvfy when writing the middle page, and a middle page verify voltage Vvfy when writing the upper page.

(3) When writing two bits in the memory cell adjacent to the section transistor S2 on the bit line BL side, write of the upper page is skipped, and the lower page and middle page are written.

[4-2] Octal Write

Figure 5:
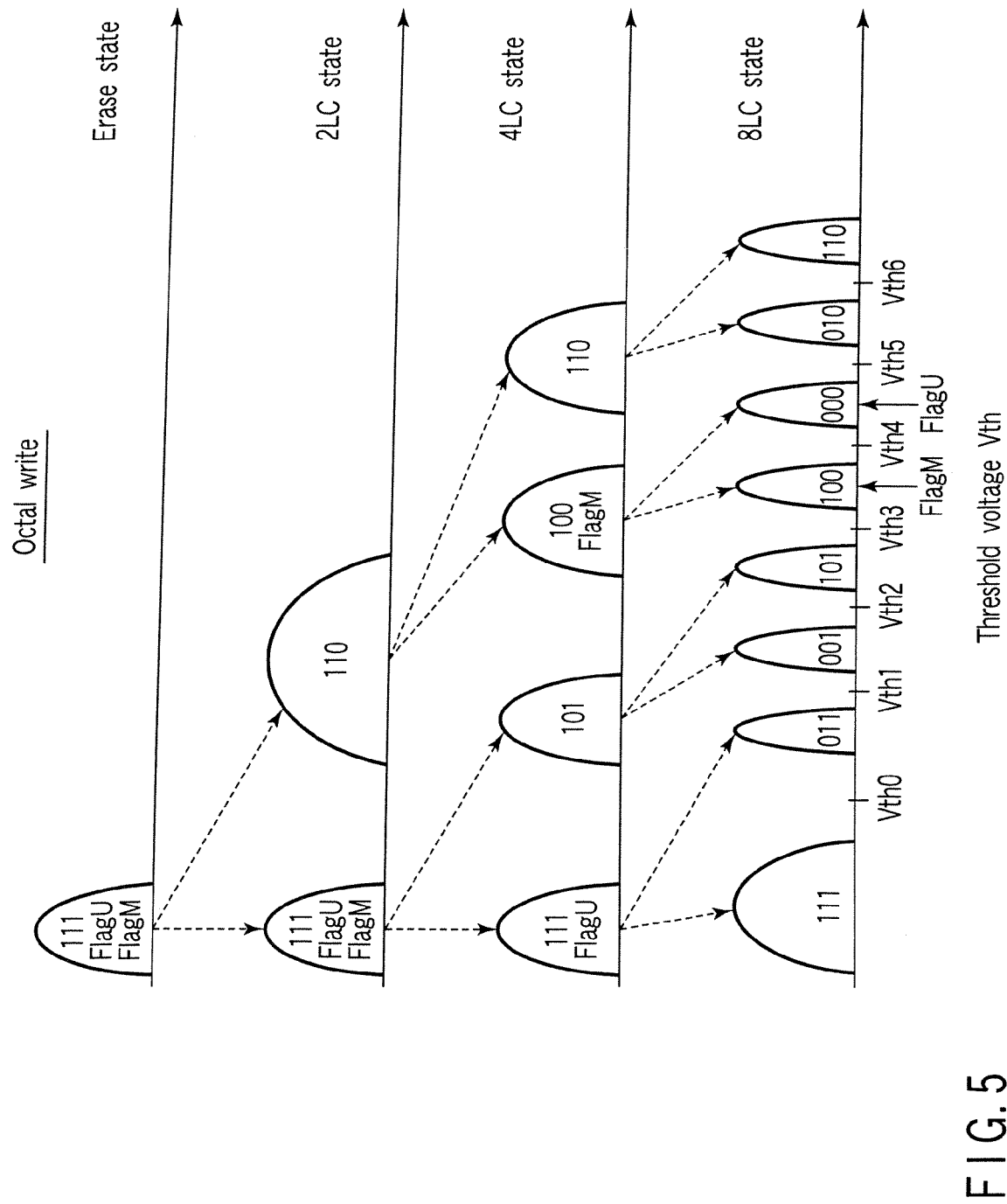
FIG. 5 is a view showing the way the threshold voltage of a memory cell changes when performing octal write according to the embodiment of the present invention.

FIG. 5 shows the way the threshold voltage of a memory cell changes when performing octal write according to the embodiment of the present invention. Referring to FIG. 5, the abscissa indicates a threshold voltage Vth, and the ordinate indicates the memory cell existence probability. A method of storing 3-bit (octal) data in one memory cell will be explained below.

The threshold distributions of the octal NAND type flash memory according to this embodiment are as shown in FIG. 5. As shown in FIG. 5, the memory cell transistor MT can hold eight data "111", "011", "001", "101", "100", "000", "010", and "110" in ascending order of the threshold voltage Vth.

The threshold voltage Vth of the memory cell transistor MT holding the data "111" is Vth<Vth0 (in this embodiment, Vth0=0 V). The threshold voltage Vth of the memory cell transistor MT holding the data "011" is Vth0<Vth<Vth1. The threshold voltage Vth of the memory cell transistor MT holding the data "001" is Vth1<Vth<Vth2. The threshold voltage Vth of the memory cell transistor MT holding the data "101" is Vth2<Vth<Vth3. The threshold voltage Vth of the memory cell transistor MT holding the data "100" is Vth3<Vth<Vth4. The threshold voltage Vth of the memory cell transistor MT holding the data "000" is Vth4<Vth<Vth5. The threshold voltage Vth of the memory cell transistor MT holding the data "010" is Vth5<Vth<Vth6. The threshold voltage Vth of the memory cell transistor MT holding the data "110" is Vth6<Vth.

Data write in this octal mode is performed in the order of a lower page, middle page, and upper page. Note that in this embodiment, the state in which only the lower page is written is called a 2LC (Level Cell) state, the state in which only the lower and middle pages are written is called a 4LC state, and the state in which all the lower, middle, and upper pages are written is called an 8LC state.

(2LC State)

Before writing data, the memory cell is in an erase state. That is, the memory cell transistor MT has a negative value as the threshold voltage Vth, and is holding the data "111" ("---", - means indefinite). Data of the lower page is written in this state to form two threshold distributions. More specifically, the data is written as follows.

First, when the lower page is "1", no electrons are injected into the charge storage layer FG, and the threshold voltage Vth remains unchanged. That is, the memory cell transistor MT keeps holding the data "111" ("--1"). On the other hand, when the lower page is "0", electrons are injected into the charge storage layer FG, and the threshold voltage Vth changes in the positive direction to become about Vth0<Vth<Vth3. That is, "110" ("--0") is written in the memory cell transistor MT.

(4LC State)

Then, the middle page is written. This divides each of the two threshold distributions of the lower page into two threshold distributions, thereby forming four threshold distributions. More specifically, the data is written as follows.

First, an operation when the lower page is "1" will be explained. When the middle page is "1", no electrons are injected into the charge storage layer FG even when writing the middle page, and the threshold voltage Vth maintains the negative value. As a consequence, "111" ("-11") is written in the memory cell transistor MT. On the other hand, when the middle page is "0", electrons are injected into the charge storage layer FG. Consequently, the threshold voltage Vth changes from the negative direction to the positive direction to become Vth0<Vth<Vth2. That is, "101" ("-01") is written in the memory cell transistor MT.

An operation when the lower page is "0" will be explained next. When the middle page is "1", electrons are further injected into the charge storage layer FG. As a result, the threshold voltage Vth further changes in the positive direction to become Vth4<Vth<Vth6. That is, "110" ("-10") is written in the memory cell transistor MT. On the other hand, when the middle page is "0", electrons are further injected into the charge storage layer FG. Consequently, the threshold voltage Vth further changes in the positive direction to become Vth2<Vth<Vth4. That is, "100" ("-00") is written in the memory cell transistor MT.

(8LC State)

Finally, the upper page is written. This divides each of the four threshold distributions of the middle page into two threshold distributions, thereby forming eight threshold distributions. More specifically, the data is written as follows.

First, an operation when the lower page is "1" and the middle page is "1" will be explained. When the upper page is "1", no electrons are injected into the charge storage layer FG even when writing the upper page, and the threshold voltage Vth maintains the negative value. Consequently, "111" is written in the memory cell transistor MT. On the other hand, when the upper page is "0", electrons are injected into the charge storage layer FG. As a result, the threshold voltage Vth changes from the negative direction to the positive direction to become Vth0<Vth<Vth1. That is, "011" is written in the memory cell transistor MT.

An operation when the lower page is "1" and the middle page is "0" will be explained. When the upper page is "1", electrons are further injected into the charge storage layer FG. Consequently, the threshold voltage Vth further changes in the positive direction to become Vth2<Vth<Vth3. That is, "101" is written in the memory cell transistor MT. On the other hand, when the upper page is "0", electrons are further injected into the charge storage layer FG. As a consequence, the threshold voltage Vth further changes in the positive direction to become Vth1<Vth<Vth2. That is, "001" is written in the memory cell transistor MT.

An operation when the lower page is "0" and the middle page is "0" will be explained. When the upper page is "1", electrons are further injected into the charge storage layer FG. As a result, the threshold voltage Vth further changes in the positive direction to become Vth3<Vth<Vth4. That is, "100" is written in the memory cell transistor MT. On the other hand, when the upper page is "0", electrons are further injected into the charge storage layer FG. Consequently, the threshold voltage Vth further changes in the positive direction to become Vth4<Vth<Vth5. That is, "000" is written in the memory cell transistor MT.

An operation when the lower page is "0" and the middle page is "1" will be explained. When the upper page is "1", electrons are further injected into the charge storage layer FG. As a consequence, the threshold voltage Vth further changes in the positive direction to become Vth6<Vth. That is, "110" is written in the memory cell transistor MT. On the other hand, when the upper page is "0", electrons are further injected into the charge storage layer FG. As a result, the threshold voltage Vth further changes in the positive direction to become Vth5<Vth<Vth6. That is, "010" is written in the memory cell transistor MT.

(Flag Cell)

As shown in FIG. 1, the flag circuit 19 is formed adjacent to the memory cell array 11 in this embodiment. A first flag cell FlagM and second flag cell FlagU are prepared in the flag circuit 19.

In the write operation described above, no data is written in the first and second flag cells FlagM and FlagU in the stage (2LC state) in which only the lower page is written. That is, the state is "111" ("---").

In the stage (4LC state) in which only the lower and middle pages are written, data is written in the first flag cell FlagM such that the threshold distribution is "100" ("-00") in FIG. 5.

In the stage (8LC state) in which all the lower, middle, and upper pages are written, data is written in the first flag cell FlagM such that the threshold distribution is "100" in FIG. 5, and written in the second flag cell FlagU such that the threshold distribution is "000" in FIG. 5.

The flag circuit 19 is thus used to check to which of the 2LC state, 4LC state, and 8LC state the data is written in the memory cell. Note that the method of using the flag circuit 19 will be explained in detail later in [5] Read Method.

[4-3] Order of Write Page Addresses

The order of write page addresses will be separately explained below by Examples 1 to 3. Example 1 is the case of the word lines WL1 to WL30 not adjacent to the selection gate lines SGS and SGD. Example 2 is the case of the word line WL0 adjacent to the selection gate line SGS on the source line side. Example 3 is the case of the word line WL31 adjacent to the selection gate line SGD on the bit line side.

EXAMPLE 1

Case of WL1-WL30

Figure 6:
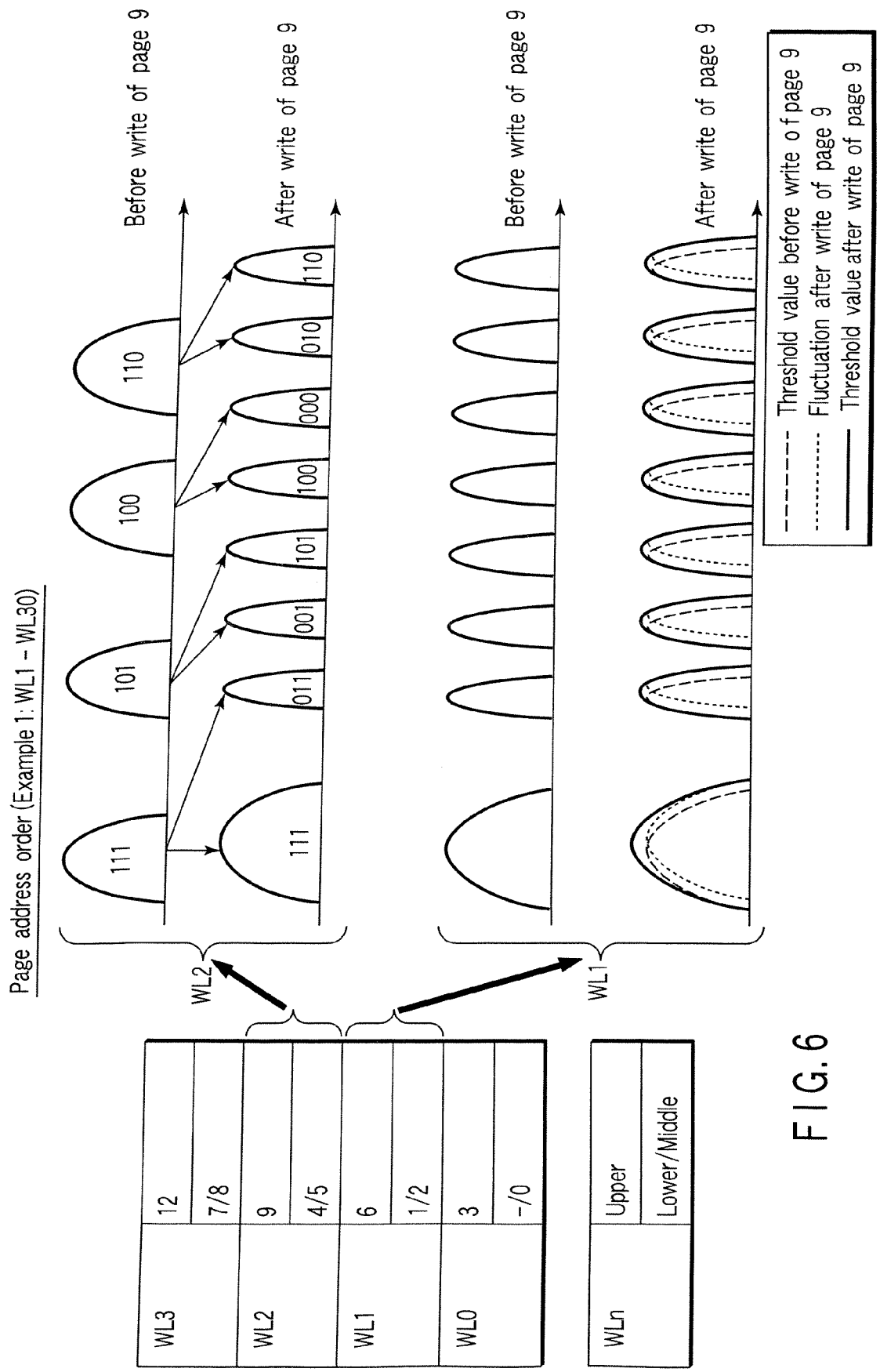
FIG. 6 is a view for explaining Example 1 of the order of page addresses when performing write according to the embodiment of the present invention.

FIG. 6 is a view for explaining Example 1 of the order of page addresses when writing data according to the embodiment of the present invention. The order of pages to be written in memory cell transistors corresponding to the word lines WL1 to WL30 will be explained below.

The order of write pages in Example 1 assigns page addresses as follows. First, after the lower and middle pages of a word line WLn are written, the lower and middle pages of a word line WLn+1 are written, and then the upper page of the word line WLn is written.

More specifically, as shown in FIG. 6, after the lower page (page 1) and middle page (page 2) of the word line WL1 are written, the lower page (page 4) and middle page (page 5) of the word line WL2 are written, and then the upper page (page 6) of the word line WL1 is written.

When the write order as described above is used, as shown in FIG. 6, the influence of the threshold fluctuation of the word line WL2 on the eight distributions of the word line WL1 is only the write of page 6 (the upper page) of the word line WL1. Also, this threshold fluctuation is only the coupling effect that is influenced by the threshold fluctuation when page 9 of the word line WL2 is written. This makes it possible to decrease the threshold fluctuation caused by coupling of the eight threshold distributions of the word line WL1.

EXAMPLE 2

Case of WL0

Figure 7:
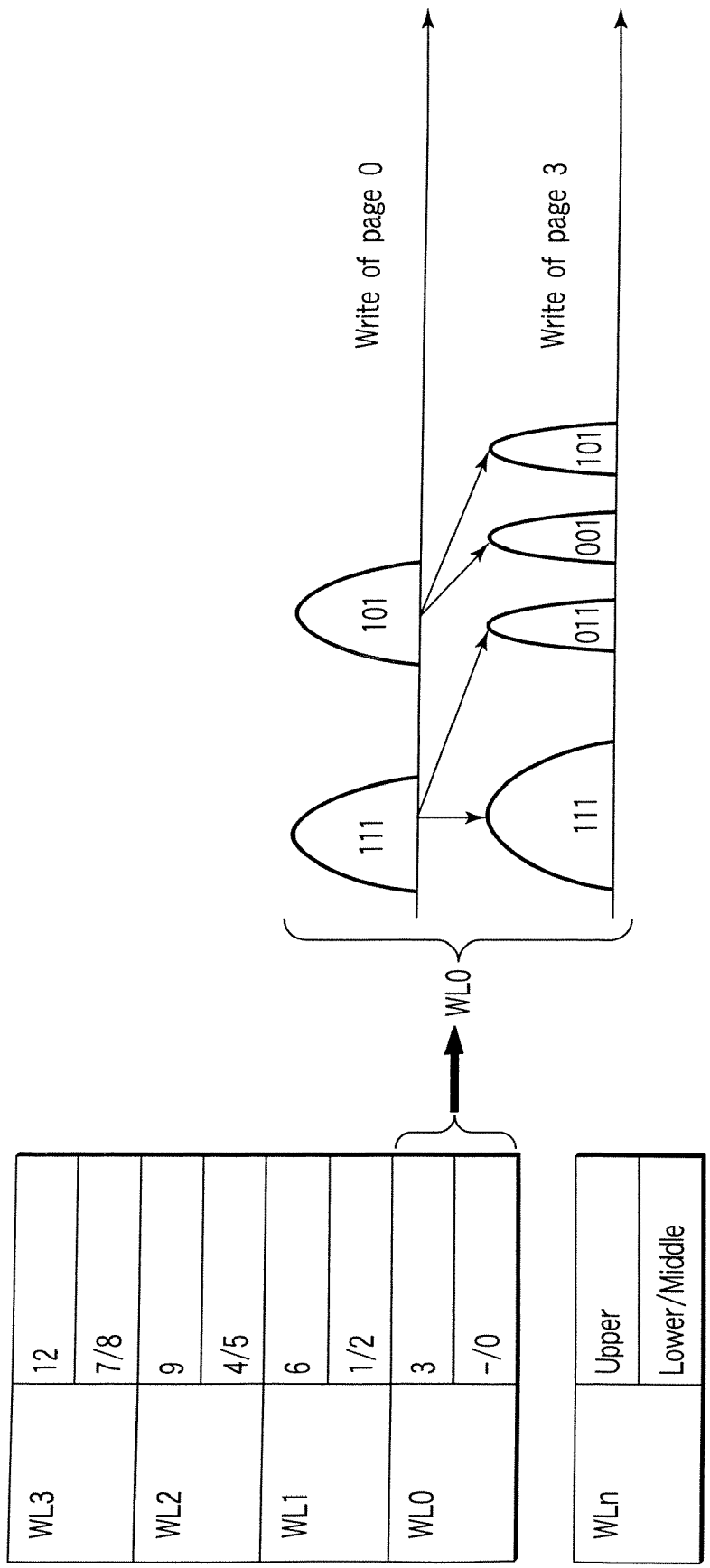
FIG. 7 is a view for explaining Example 2 of the order of page addresses when performing write according to the embodiment of the present invention.

FIG. 7 is a view for explaining Example 2 of the order of page addresses when writing data according to the embodiment of the present invention. The order of pages to be written in memory cell transistors corresponding to the word line WL0 will be explained below.

The reliability of the memory cell transistors MT corresponding to the word line WL0 is low because the gate adjacent to the source line is not a memory cell but a selection gate. Accordingly, the memory cells corresponding to the word line WL0 have four threshold distributions, instead of eight threshold distributions.

In Example 2, therefore, addresses are assigned by apparently skipping the lower page of the word line WL0, so that the influence of adjacent coupling caused by write of the word line WL1 is equal to those of other word lines WL. That is, after the middle page (page 0) of the word line WL0 is written, the lower page (page 1) and middle page (page 2) of the word line WL1 are written, and then the upper page (page 3) of the word line WL0 is written.

This write operation generates a 4-level threshold value on the word line WL0. In Example 2, as in Example 1, the coupling effect that the memory cells on the word line WL0 receive when writing data in cells on the word line WL1 is only the threshold fluctuation when writing the upper page (page 6) of the word line WL1. Accordingly, it is possible to obtain four highly reliable threshold distributions on the word line WL0, and decrease the threshold fluctuation caused by the coupling of these four threshold distributions at the same time.

EXAMPLE 3

Case of WL31

Figure 8:
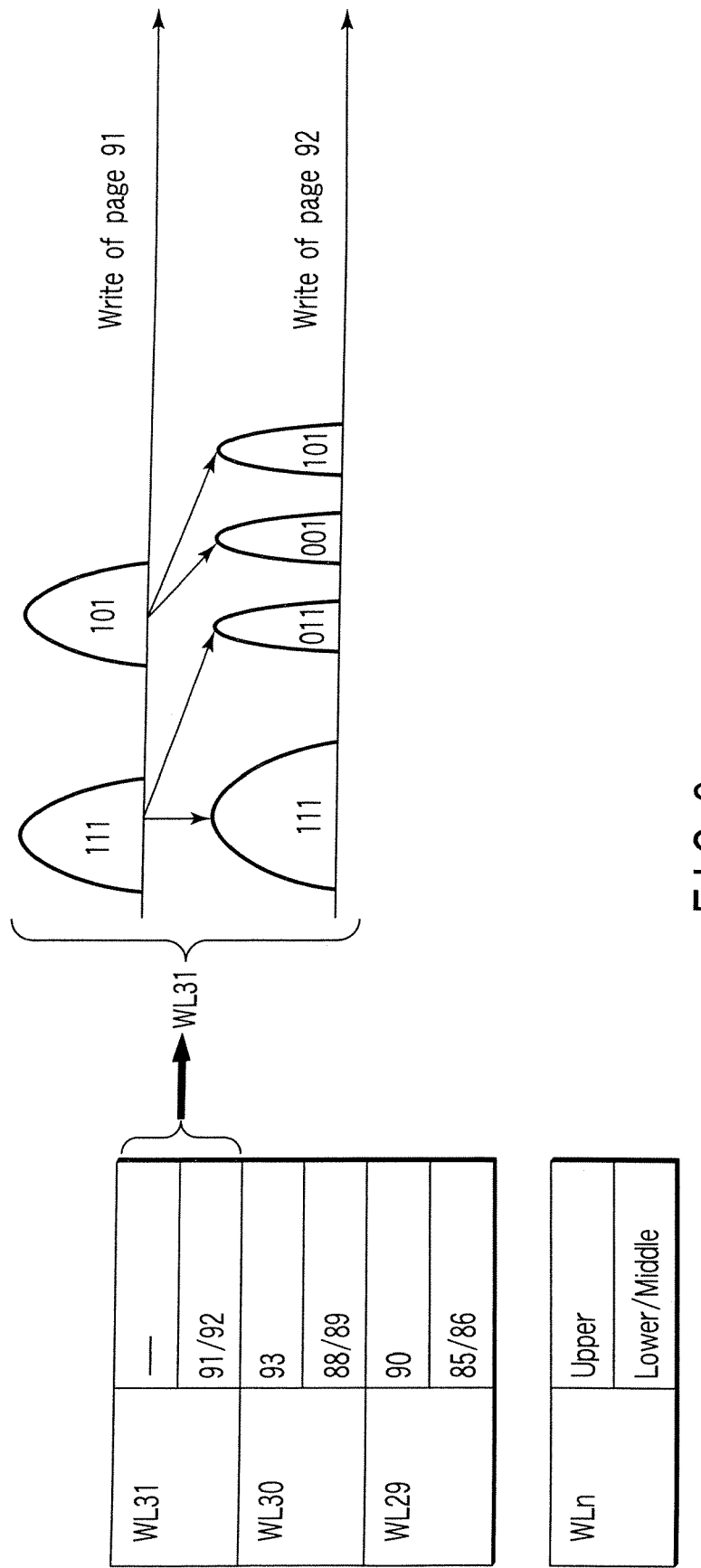
FIG. 8 is a view for explaining Example 3 of the order of page addresses when performing write according to the embodiment of the present invention.

FIG. 8 is a view for explaining Example 1 of the order of page addresses when writing data according to the embodiment of the present invention. The order of pages to be written in memory cell transistors corresponding to the word line WL31 will be explained below.

The reliability of the memory cell transistors MT corresponding to the word line WL31 is low because the gate adjacent to the bit line is not a memory cell but a selection gate. Accordingly, the word line WL31 has four threshold distributions, instead of eight threshold distributions.

In Example 3, therefore, addresses are assigned by skipping the upper page of the word line WL31. That is, the lower page (page 91) and middle page (page 92) of the word line WL31 are written, and then the upper page (page 93) of the word line WL30 is written to complete the write operation. This write operation generates a highly reliable 4-level threshold value on the word line WL31.

[4-4] Verify Read

The write operation of this embodiment sets the verify voltage Vvfy for each of the lower, middle, and upper pages, and uses verify read.

EXAMPLE 1

Figure 9:
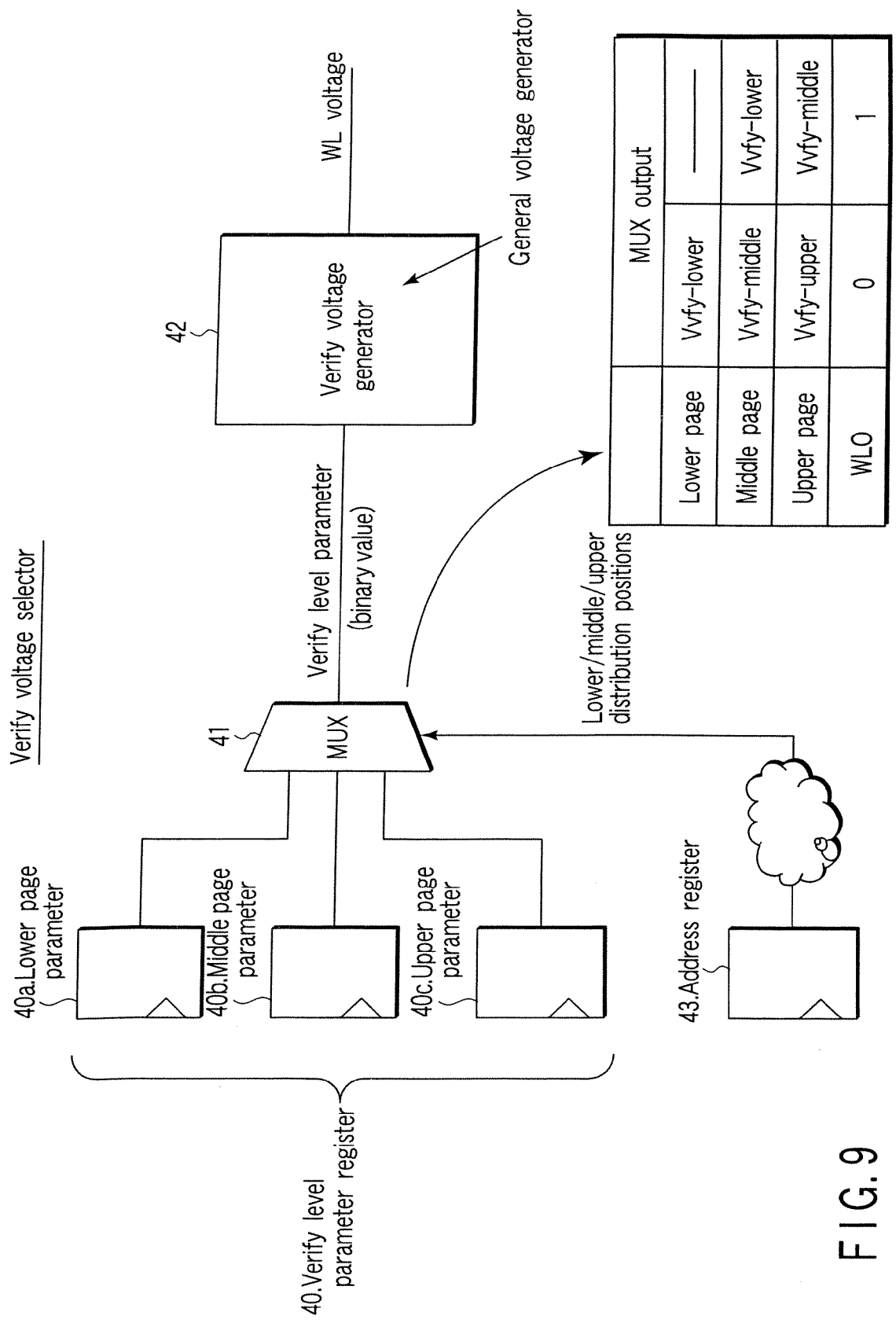
FIG. 9 is a schematic view of a verify voltage selector for Example 1 of verify read according to the embodiment of the present invention.
Figure 10:
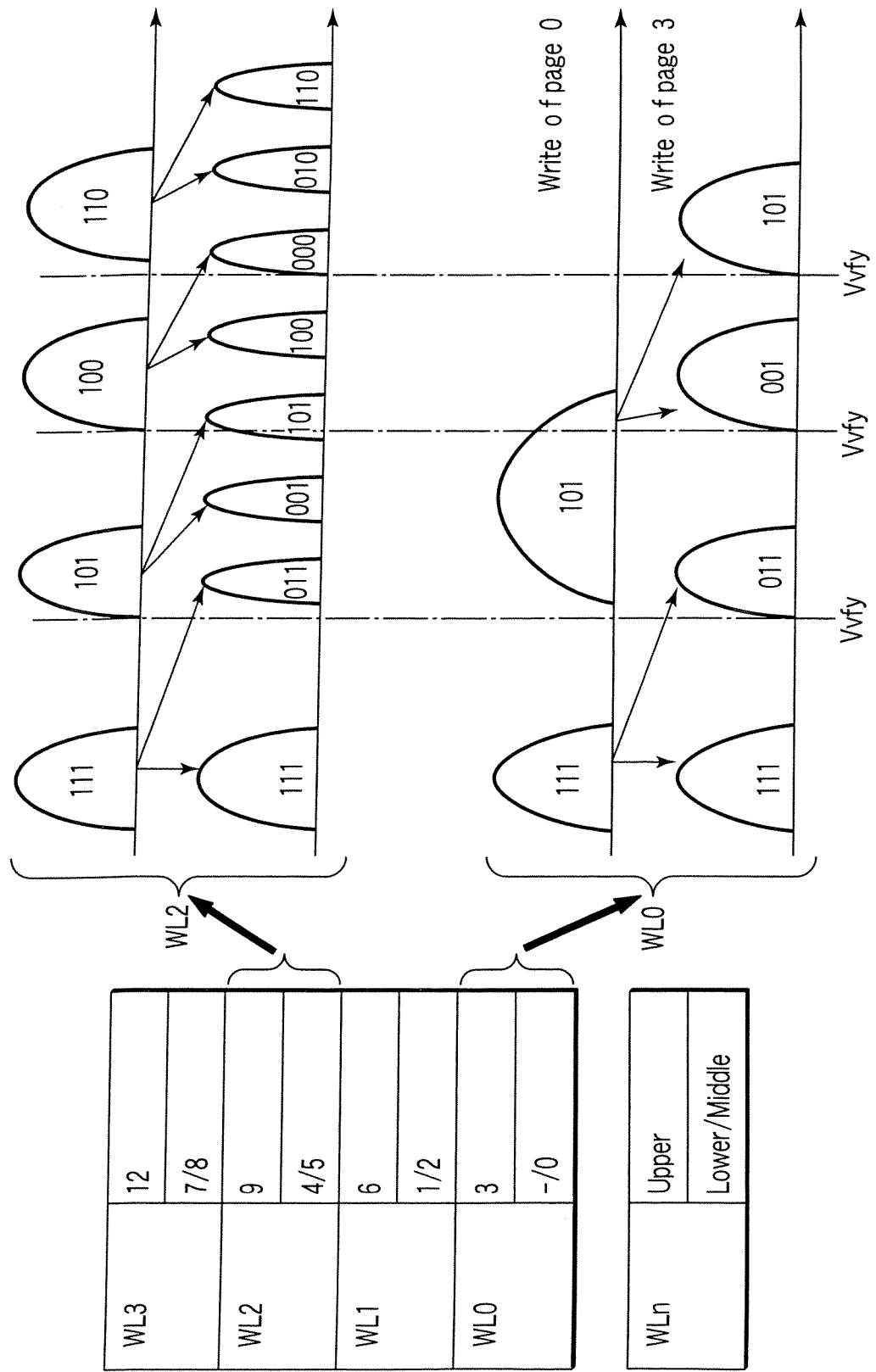
FIG. 10 is a view for explaining Example 1 of verify read according to the embodiment of the present invention.

FIG. 9 is a schematic view of a verify voltage selector of Example 1 of verify read according to the embodiment of the present invention. FIG. 10 is a view for explaining Example 1 of verify read according to the embodiment of the present invention. Verify read using the verify voltage selector of Example 1 will be explained below. Note that this verify voltage selector is used as a write circuit for memory cell transistors corresponding to the word line WL0 as an object of 4-level write.

As shown in FIG. 9, the verify voltage selector of Example 1 comprises a verify level parameter register 40, multiplexer (MUX) 41, verify voltage generator 42, and address register 43. Of these components, the control signal & control voltage generator 17 shown in FIG. 1 includes the verify level parameter register 40, multiplexer 41, and verify voltage generator 42. The data input/output buffer 14 shown in FIG. 1 includes the address register 43.

The verification lever parameter register 40 has a lower page parameter 40a, middle page parameter 40b, and upper page parameter 40c.

The multiplexer 41 receives the outputs from the verify level parameter register 40 and address register 43, and outputs a verify level parameter.

On the basis of the verify level parameter, the verify voltage generator 42 outputs a word line voltage. The verify voltage generator 42 is a general voltage generator.

This verify voltage selector is controlled so as to output the lower page parameter 40a from the multiplexer 41 when writing the middle page (page 0) of the word line WL0, and output the middle page parameter 40b from the multiplexer 41 when writing the upper page (page 3) of the word line WL0.

Verify read that the verify voltage selector described above performs for memory cell transistors corresponding to the word line WL0 as an object of 4-level write will be explained below.

As described previously, the lower page is skipped when performing 4-level write on the word line WL0. In this case, to make the reliability of memory cell transistors on the word line WL0 equivalent to the middle page, it is favorable to make the position of the threshold distribution equivalent to the middle page. Therefore, the word line voltages of write verify are switched by using the verify voltage selector shown in FIG. 9.

More specifically, write and verify read are alternately performed when writing data. After verify read is performed, whether a predetermined verify voltage Vvfy is reached is checked, and write is repeated until the verify voltage Vvfy is exceeded. The verify voltage Vvfy is the word line voltage applied to the word line WL0 when performing verify read, and equivalent to the lower limit of the threshold value of a memory cell in which data is written as shown in FIG. 10.

The verify voltage Vvfy is changed for each threshold distribution. More specifically, as shown in FIG. 9, the verify level is held as a binary value in the verify level parameter register 40. In accordance with a write page address from the address register 43, the multiplexer 41 switches the verify level parameters, and inputs the binary value to the verify voltage generator 42. The verify voltage generator 42 outputs a word line voltage corresponding to the input binary value.

When writing the upper page, the upper page verify level is normally used. However, this embodiment uses the lower page parameter 40a when writing the middle page (page 0) of the word line WL0, and the middle page parameter 40b when writing the upper page (page 3) of the word line WL0. This makes the position of the threshold value equal to the middle page, and improves the reliability.

Note that the binary value of the verify level need not always be held in the verify level parameter register 40, and may also be simple fixed data.

EXAMPLE 2

Example 2 is a modification of Example 1, and discloses a variation of verify level control.

In Example 2, the verify voltage selector shown in FIG. 9 further comprises a register R having an offset parameter for the word line WL0 only. The register R has a page 0 shift value and page 3 shift value.

When writing page 0 (the middle page) in Example 2, the verify voltage generator 42 receives data obtained by adding "the page 0 shift value" output from the register R to "the lower page verify level" output from the multiplexer 41 shown in FIG. 9.

Similarly, when writing page 3, the verify voltage generator 42 receives data obtained by adding "the page 3 shift value" output from the register R to "the middle page verify level" output from the multiplexer 41 shown in FIG. 9.

Note that completely different parameters may also be used, but simple offset makes it possible to reduce the number of registers.

[4-5] Write

In the write operation of this embodiment, a program (program verification) voltage Vpgm may also be set for each of the lower, middle, and upper pages.

Figure 12:
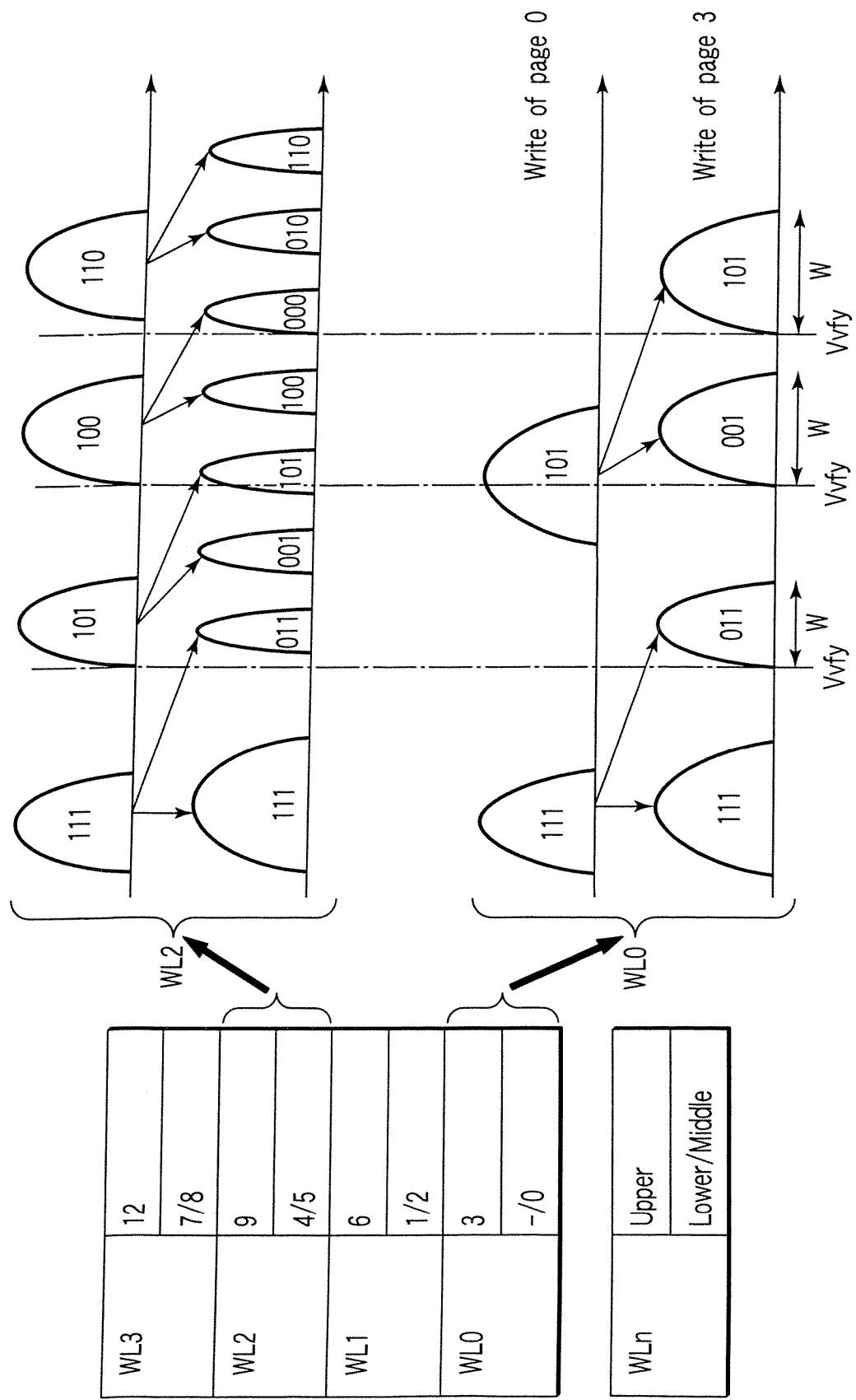
FIG. 12 is a view for explaining write according to the embodiment of the present invention.

FIG. 11 is a schematic view of a program voltage selector for write according to the embodiment of the present invention. FIG. 12 is a view for explaining write according to the embodiment of the present invention. A write operation using the program voltage selector will be explained below. Note that this program voltage selector is used as a write circuit for memory cell transistors corresponding to the word line WL0 as an object of 4-level write.

As shown in FIG. 11, the program voltage selector comprises a program level parameter register 50, multiplexer (MUX) 51, program voltage pumping circuit 52, and address register 53. Of these components, the control signal & control voltage generator 17 shown in FIG. 1 includes the program level parameter register 50, multiplexer (MUX) 51, and program voltage pumping circuit 52. The data input/output buffer 14 shown in FIG. 1 includes the address register 53.

The program level parameter register 50 has a lower page parameter 50a, middle page parameter 50b, and upper page parameter 50c. The lower page parameter 50a, middle page parameter 50b, and upper page parameter 50c each have a program verify voltage Vpgm and shift voltage dVpgm.

The multiplexer 51 receives the outputs from the program level parameter register 50 and address register 53, and outputs the program level parameter.

On the basis of the program level parameter, the program voltage pumping circuit 52 outputs a word line voltage. The program voltage pumping circuit 52 is a general pumping circuit.

The program voltage selector as described above is used to make not only a position Vvfy but also a width W of the verify read level threshold distribution at the time of verification equal to the middle page. More specifically, the word line applied voltage of the lower page parameter 50a is used when writing the middle page (page 0) of the word line WL0, and the word line applied voltage of the middle page parameter 50b is used when writing the upper page (page 3) of the word line WL0. Since this makes not only the position Vvfy but also the width W of the threshold distribution equal to the middle page as shown in FIG. 12, the write speed increases.

[5] Read Method

In this embodiment, a read method when multilevel data is stored in one memory cell will be explained. This read operation performs read in the order of the lower, middle, and upper pages. A read method of each page will be explained below.

[5-1] Read Method of Lower Page

Figure 13:
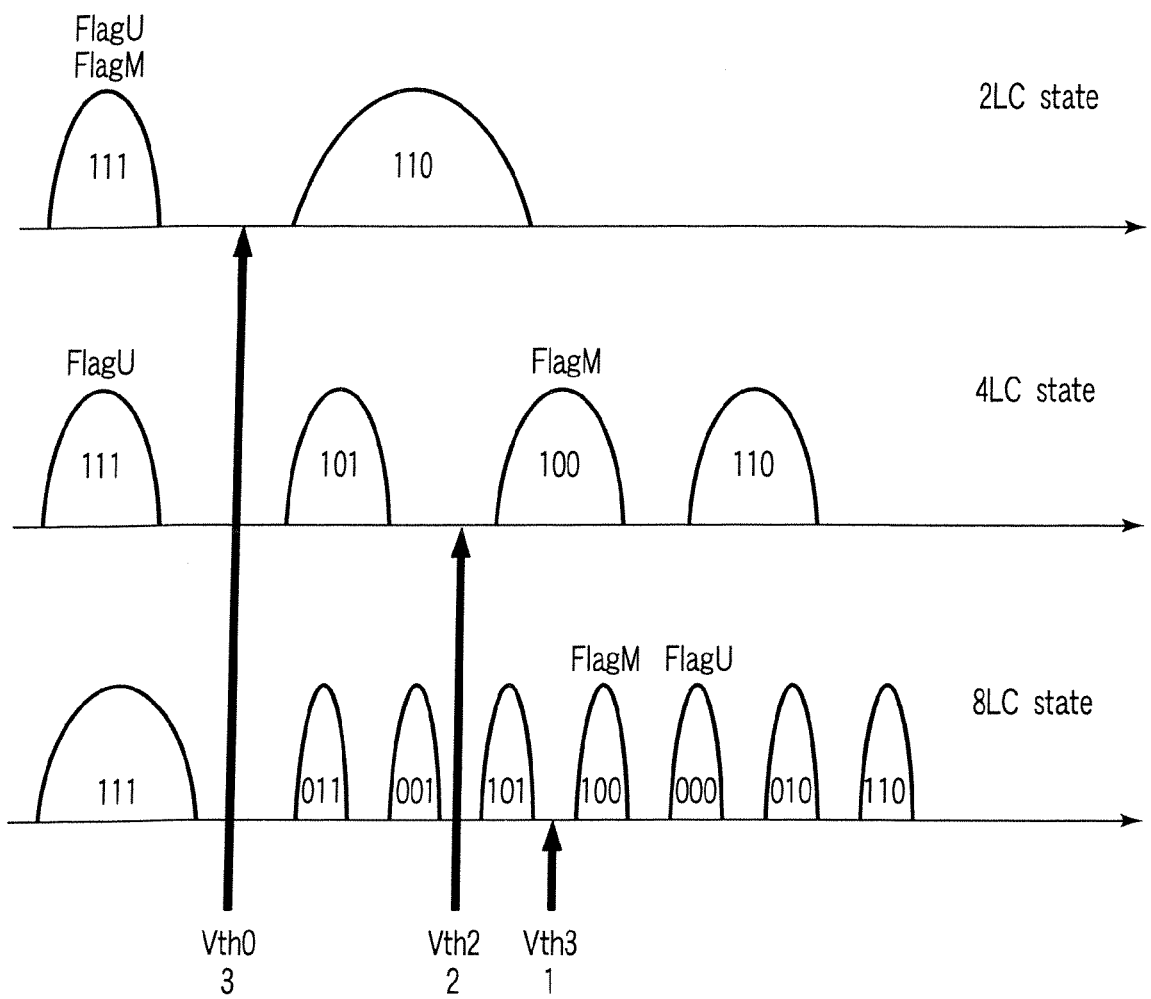
FIG. 13 is a view for explaining a lower page read method according to the embodiment of the present invention, which shows the way the threshold voltage of a memory cell is set.

FIG. 13 shows the way the threshold voltage of a memory cell is set, in order to explain a lower page read method according to the embodiment of the present invention. Referring to FIG. 13, the abscissa indicates the threshold voltage Vth, and the ordinate indicates the memory cell existence probability. The lower page read method will be explained below with reference to FIG. 13.

As shown in FIG. 13, the 8LC state in which all the lower, middle, and upper pages are written has eight threshold distributions, the 4LC state in which only the lower and middle pages are written has four threshold distributions, and the 2LC state in which only the lower page is written has two threshold distributions. Therefore, the flag cells FlagM and FlagU are used to check to which of the lower, middle, and upper pages the data is written in a memory cell, i.e., whether the number of threshold distributions is two, four, or eight. More specifically, read is performed by the following procedure.

First, read is performed at the threshold voltage Vth3.

In this case, if the flag cell FlagU is in the write state, eight threshold distributions are formed, i.e., the memory cell is in the 8LC state in which all the lower, middle, and upper pages are written. Accordingly, the sense result of the threshold voltage Vth3 is directly the lower page data.

On the other hand, if the flag cell FlagU is not in the write state, the memory cell is in the 2LC state in which only the lower page is written or the 4LC state in which the lower and middle pages are written, so reread is necessary. Therefore, read is performed at the threshold voltage Vth2.

In this case, if the flag cell FlagM is in the write state, four threshold distributions are formed, i.e., the memory cell is in the 4LC state in which the lower and middle pages are written. Accordingly, the sense result of the threshold voltage Vth2 is directly the lower page data.

On the other hand, if neither the flag cell FlagU nor the flag cell FlagM is in the write state, the memory cell is in the 2LC state in which only the lower page is written, i.e., two threshold distributions are written. Therefore, reread is performed at the threshold voltage Vth0. The result is the lower page data.

[5-2] Read Method of Middle Page

Figure 14:
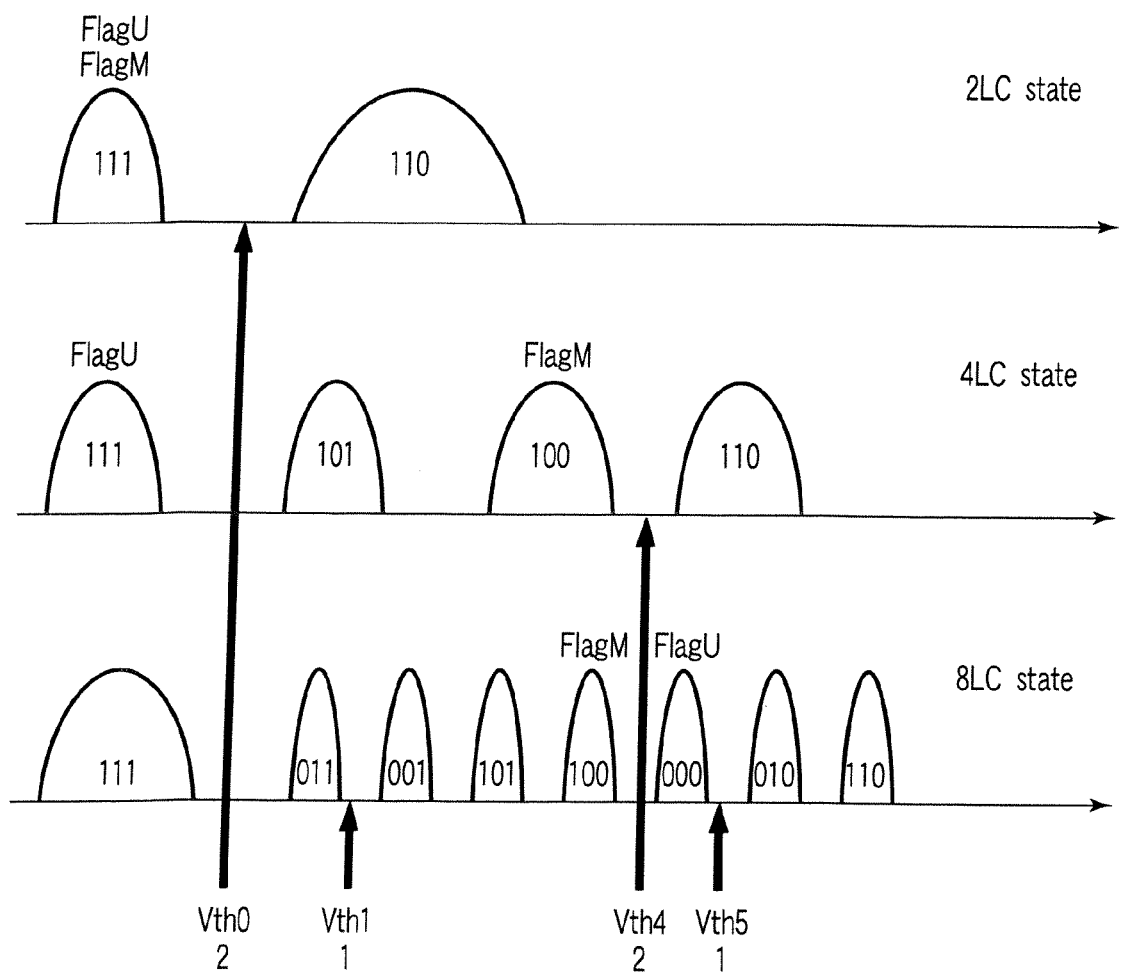
FIG. 14 is a view for explaining a middle page read method according to the embodiment of the present invention, which shows the way the threshold voltage of a memory cell is set.

FIG. 14 shows the way the threshold voltage of a memory cell is set, in order to explain a middle page read method according to the embodiment of the present invention. Referring to FIG. 14, the abscissa indicates the threshold voltage Vth, and the ordinate indicates the memory cell existence probability. The middle page read method will be explained below with reference to FIG. 14.

In middle page read, similar to lower page read, the number of threshold distributions is checked on the basis of the write states of the flat cell FlagM and flag cell FlagU, and reread is performed where necessary.

First, read is performed at the threshold voltage Vth1 or Vth5. The state of the flag cell FlagU when read is performed at the threshold voltage Vth1 is checked.

In this case, if the flag cell FlagU is in the write state, eight threshold distributions are formed, i.e., the memory cell is in the 8LC state in which all the lower, middle, and upper pages are written. Accordingly, the sense result of the threshold voltage Vth1 is directly the middle page data.

On the other hand, if the flag cell FlagU is not in the write state, read is performed at the threshold voltage Vth0 or Vth4. The state of the flag cell FlagM when read is performed at the threshold voltage Vth0 is checked.

If the flag cell FlagM is in the write state, four threshold distributions are formed, i.e., the memory cell is in the 4LC state in which the lower and middle pages are written. Accordingly, the sense result of the threshold voltage Vth0 or Vth4 is the middle page data.

On the other hand, if the flag cell FlagM is not in the write state, the memory cell is in the 2LC state in which only the lower page is written, i.e., only two threshold distributions exist. Therefore, all bits of the middle page data are "1".

[5-3] Read Method of Upper Page

Figure 15:
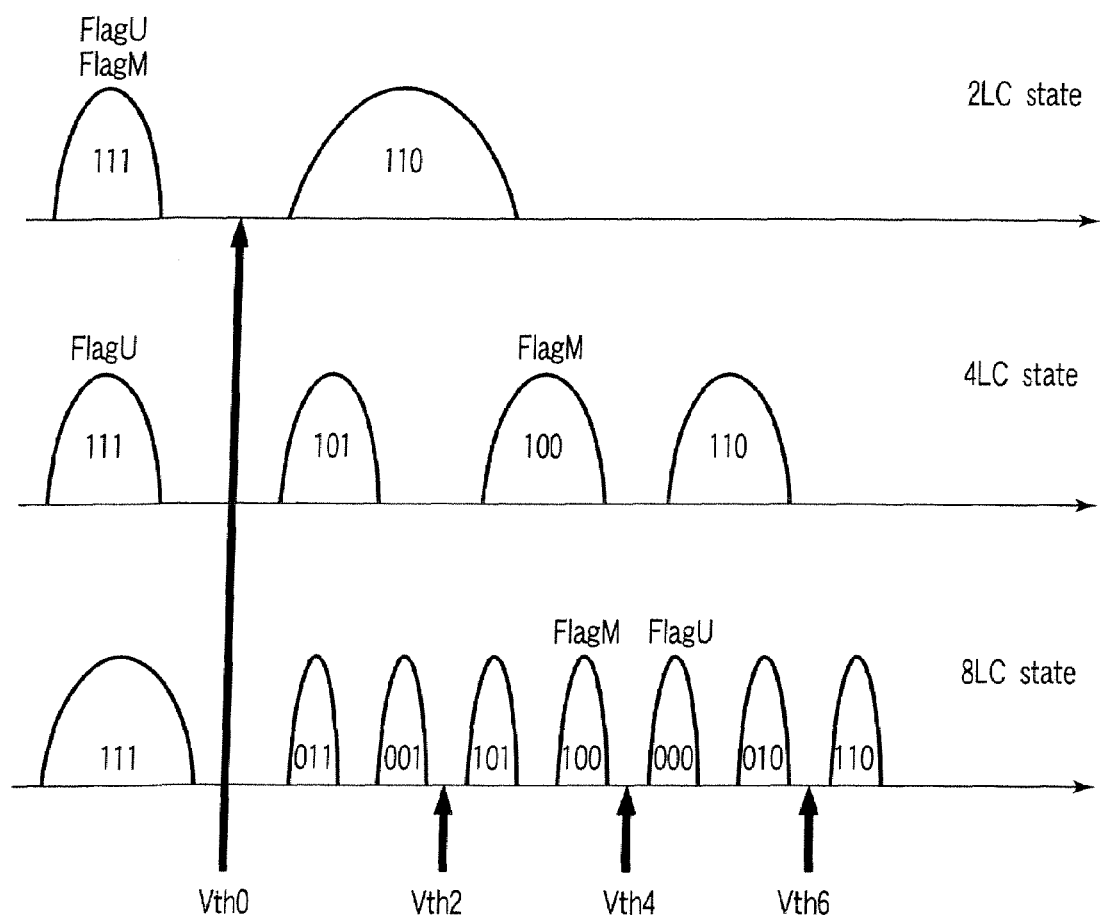
FIG. 15 is a view for explaining an upper page read method according to the embodiment of the present invention, which shows the way the threshold voltage of a memory cell is set.

FIG. 15 shows the way the threshold voltage of a memory cell is set, in order to explain an upper page read method according to the embodiment of the present invention. Referring to FIG. 15, the abscissa indicates the threshold voltage Vth, and the ordinate indicates the memory cell existence probability. The upper page read method will be explained below with reference to FIG. 15.

As shown in FIG. 15, the upper page is read at one of the threshold voltages Vth0, Vth2, Vth4, and Vth6 in accordance with the lower page data and middle page data. The sense result of each of the threshold voltages Vth0, Vth2, Vth4, and Vth6 is directly the upper page data.

On the other hand, if the flag cell FlagU is not in the write state, the memory cell is in the 2LC state in which only the lower page is written or the 4LC state. Therefore, all bits of the middle page data and lower page data are "1".

[6] Effects

In the multilevel NAND type flash memory according to the embodiment of the present invention, the memory cell transistors adjacent to the selection transistors S1 and S2 hold 2-bit (4-level) data, and other memory cell transistors hold data having three bits (eight levels) or more. In this memory, write of the lower page is skipped when writing two bits in the memory cell adjacent to the selection transistor S1 on the source line SL side. In this case, the position of the threshold distribution of the verify read level is changed to set the lower page verify voltage Vvfy when writing the middle page, and the middle page verify voltage Vvfy when writing the upper page. Write like this can decrease the threshold fluctuation width in one write operation, and reduce the coupling effect caused by the threshold fluctuation of an adjacent memory cell. It is also possible to improve the reliability of particularly the memory cell transistor MT adjacent to the selection transistor S1 on the source line SL side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A NAND type flash memory comprising:
a first selection transistor;
a second selection transistor;
a first memory cell transistor, a second memory cell transistor, and a third memory cell transistor having current paths connected in series between one end of a current path of the first selection transistor and one end of a current path of the second selection transistor, and each having a control gate and a charge storage layer;
the first memory cell transistor being adjacent to the first selection transistor;
the second memory cell transistor being adjacent to the second selection transistor;
the third memory cell transistor being not adjacent to the first selection transistor and the second selection transistor and being positioned between the first memory cell transistor and the second memory cell transistor;
the third memory cell transistor holding data having not less than three bits;
the first memory cell transistor holding 2-bit data in which a middle page and an upper page is written by skipping a lower page; and
a lower page verify voltage being set when writing the middle page, and a middle page verify voltage is set when writing the upper page, changing a position of a threshold distribution of the first memory cell transistor.

2. The memory according to claim 1, wherein the first memory cell transistor is adjacent to the first selection transistor whose current path has the other end connected to a source line.

3. The memory according to claim 1, further comprising:
a verify voltage selector having a verify level parameter register, a multiplexer, and a verify voltage generator;
the verify level parameter register having a lower page parameter, a middle page parameter, and an upper page parameter;
the multiplexer receiving the lower page parameter, the middle page parameter, and the upper page parameter from the verify level parameter register, outputting the lower page parameter when writing the middle page, and outputting the middle page parameter when writing the upper page; and
the verify voltage generator applying a verify voltage to a gate of the first memory cell transistor in accordance with the lower page parameter and the middle page parameter output from the multiplexer, changing the position of the threshold distribution of the first memory cell transistor.

4. The memory according to claim 1, wherein a lower page application voltage is used when writing the middle page, and a middle page application voltage is used when writing the upper page, changing a width of the threshold distribution of the first memory cell transistor.

5. The memory according to claim 4, further comprising:
a verify voltage selector having a verify level parameter register, a multiplexer, and a pumping circuit;
the verify level parameter register having a lower page parameter, a middle page parameter, and an upper page parameter;
the multiplexer receiving the lower page parameter, the middle page parameter, and the upper page parameter from the verify level parameter register, outputting the lower page parameter when writing the middle page, and outputting the middle page parameter when writing the upper page; and
the pumping circuit applying a verify voltage to a gate of the first memory cell transistor in accordance with the lower page parameter and the middle page parameter output from the multiplexer, changing the width of the threshold distribution of the first memory cell transistor.

6. The memory according to claim 1, wherein the second memory cell transistor is adjacent to the second selection transistor whose current path has the other end connected to a bit line.

7. The memory according to claim 6, wherein the second memory cell transistor holds 2-bit data in which a lower page and a middle page are written by skipping an upper page.

8. The memory according to claim 1, wherein the first memory cell transistor and the second memory cell transistor each hold 2-bit data, and the third memory cell transistor holds 3-bit data.

9. A write method of NAND type flash memory comprising:
a first selection transistor;
a second selection transistor;
a first memory cell transistor, a second memory cell transistor, and a third memory cell transistor having current paths connected in series between one end of a current path of the first selection transistor and one end of a current path of the second selection transistor, and each having a control gate and a charge storage layer;
the first memory cell transistor being adjacent to the first selection transistor;
the second memory cell transistor being adjacent to the second selection transistor;
the third memory cell transistor being not adjacent to the first selection transistor and the second selection transistor and being positioned between the first memory cell transistor and the second memory cell transistor;

data having not less than three bits being written in the third memory cell transistor;

2-bit data being written in the first memory cell transistor by skipping a lower page, writing a middle page, and then writing an upper page; and a lower page verify voltage being set when writing the middle page, and a middle page verify voltage is set when writing the upper page, changing a position of a threshold distribution of the first memory cell transistor.

10. The method according to claim 9, wherein the first memory cell transistor is adjacent to the first selection transistor whose current path has the other end connected to a source line.

11. The method according to claim 9, further comprising:

a verify voltage selector having a verify level parameter register, a multiplexer, and a verify voltage generator;

the verify level parameter register having a lower page parameter, a middle page parameter, and an upper page parameter;

the multiplexer receiving the lower page parameter, the middle page parameter, and the upper page parameter from the verify level parameter register, outputting the lower page parameter when writing the middle page, and outputting the middle page parameter when writing the upper page; and the verify voltage generator applying a verify voltage to a gate of the first memory cell transistor in accordance with the lower page parameter and the middle page parameter output from the multiplexer, changing the position of the threshold distribution of the first memory cell transistor.

12. The method according to claim 9, wherein a lower page application voltage is used when writing the middle page, and a middle page application voltage is used when writing the upper page, changing a width of the threshold distribution of the first memory cell transistor.

13. The memory according to claim 12, further comprising:

a verify voltage selector having a verify level parameter register, a multiplexer, and a pumping circuit;

the verify level parameter register having a lower page parameter, a middle page parameter, and an upper page parameter;

the multiplexer receiving the lower page parameter, the middle page parameter, and the upper page parameter from the verify level parameter register, outputting the lower page parameter when writing the middle page, and outputting the middle page parameter when writing the upper page; and the pumping circuit applying a verify voltage to a gate of the first memory cell transistor in accordance with the lower page parameter and the middle page parameter output from the multiplexer, changing the width of the threshold distribution of the first memory cell transistor.

14. The method according to claim 9, wherein the second memory cell transistor is adjacent to the second selection transistor whose current path has the other end connected to a bit line.

15. The method according to claim 14, wherein the second memory cell transistor holds 2-bit data in which a lower page and a middle page are written by skipping an upper page.

16. The method according to claim 9, wherein 2-bit data is written in the first memory cell transistor and the second memory cell transistor, and 3-bit data is written in the third memory cell transistor.

17. The method according to claim 9, wherein the first memory cell transistor is adjacent to the first selection transistor whose current path has the other end connected to a source line, and adjacent to the third memory cell transistor;

the middle page is written in the first memory cell transistor; and the lower page and the middle page are written in order in the third memory cell transistor, and then the upper page is written in the first memory cell transistor.

18. The method according to claim 9, wherein the second memory cell transistor is adjacent to the second selection transistor whose current path has the other end connected to a bit line, and adjacent to the third memory cell transistor; and the lower page and the middle page are written in order in the second memory cell transistor, and then the upper page is written in the third memory cell transistor.

19. The method according to claim 9, further comprising:

a first flag cell and a second flag cell; and when 3-bid data including a lower page, a middle page, and an upper page is written in the third memory cell transistor, the first flag cell having a first threshold distribution when only the lower page and the middle page are written in the third memory cell transistor, and the second flag cell having a second threshold distribution when all the lower page, the middle page, and the upper page are written in the third memory cell transistor.

20. The method according to claim 9, wherein the first flag cell and the second flag cell are used to check which of a 2-bit write state, a 4-bit write state, and an 8-bit write state is a write state of the third memory cell transistor.

* * * * *